United States Patent
Zhou et al.

(10) Patent No.: US 9,171,911 B2
(45) Date of Patent: Oct. 27, 2015

(54) ISOLATION STRUCTURE IN GALLIUM NITRIDE DEVICES AND INTEGRATED CIRCUITS

(71) Applicant: Efficient Power Conversion Corporation, El Segundo, CA (US)

(72) Inventors: Chunhua Zhou, El Segundo, CA (US); Jianjun Cao, Torrance, CA (US); Alexander Lidow, Marina Del Rey, CA (US); Robert Beach, La Crescenta, CA (US); Alana Nakata, Redondo Beach, CA (US); Robert Strittmatter, Tujunga, CA (US); Guangyuan Zhao, Torrance, CA (US); Seshadri Kolluri, San Jose, CA (US); Yanping Ma, Torrance, CA (US); Fang Chang Liu, Taiwan (TW); Ming-Kun Chiang, Hsinchu (TW); Jiali Cao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 14/322,659

(22) Filed: Jul. 2, 2014

(65) Prior Publication Data
US 2015/0008442 A1 Jan. 8, 2015

Related U.S. Application Data

(60) Provisional application No. 61/843,810, filed on Jul. 8, 2013.

(51) Int. Cl.
*H01L 29/778* (2006.01)
*H01L 29/30* (2006.01)
(Continued)

(52) U.S. Cl.
CPC ...... *H01L 29/2003* (2013.01); *H01L 29/66462* (2013.01); *H01L 29/7786* (2013.01); *H01L 21/76* (2013.01); *H01L 27/0605* (2013.01); *H01L 29/778* (2013.01)

(58) Field of Classification Search
CPC .............. H01L 29/778; H01L 29/7786; H01L 29/2003; H01L 29/267; H01L 29/66462; H01L 27/0605; H01L 21/76
USPC ........ 257/59, 76, 77, 192, 194, 206, E29.104, 257/E27.061, E21.159, E21.403; 438/47, 438/172, 275, 400
See application file for complete search history.

(56) References Cited

U.S. PATENT DOCUMENTS

| 5,834,820 A | 11/1998 | Casper et al. |
| 5,849,614 A | 12/1998 | Chan |

(Continued)

OTHER PUBLICATIONS

Y. Uemoto et al., "GaN Monolithic Inverter IC Using Normally-off Gate Injection Transistors with Planar Isolation on Si Substrate", Advanced Technology Research Laboratories, pp. 165-168, 2009.

(Continued)

*Primary Examiner* — Dao H Nguyen
(74) *Attorney, Agent, or Firm* — Dickstein Shapiro LLP (57) ABSTRACT

An integrated semiconductor device which includes a substrate layer, a buffer layer formed on the substrate layer, a gallium nitride layer formed on the buffer layer, and a barrier layer formed on the gallium nitride layer. Ohmic contacts for a plurality of transistor devices are formed on the barrier layer. Specifically, a plurality of first ohmic contacts for the first transistor device are formed on a first portion of the surface of the barrier layer, and a plurality of second ohmic contacts for the second transistor device are formed on a second portion of the surface of the barrier layer. In addition, one or more gate structures formed on a third portion of the surface of the barrier between the first and second transistor devices. Preferably, the one or more gate structures and the spaces between the gate structures and the source contacts of the transistor devices collectively form an isolation region that electrically isolates the first transistor device from the second transistor device.

26 Claims, 5 Drawing Sheets (51) Int. Cl.
  *H01L 29/20* (2006.01)
  *H01L 29/66* (2006.01)
  *H01L 21/76* (2006.01)
  *H01L 27/06* (2006.01)

(56) References Cited

U.S. PATENT DOCUMENTS

| | | | |
|---|---|---|---|
| 2003/0189455 A1 | 10/2003 | Fotouhi | |
| 2005/0040792 A1 | 2/2005 | Nair | |
| 2007/0252230 A1* | 11/2007 | Zhu et al. | 257/499 |
| 2009/0072243 A1* | 3/2009 | Suda et al. | 257/77 |
| 2010/0117120 A1 | 5/2010 | Yamashita | |
| 2010/0117188 A1 | 5/2010 | Waldrab et al. | |
| 2010/0200919 A1* | 8/2010 | Kikuchi | 257/351 |
| 2010/0317163 A1 | 12/2010 | Seliskar | |
| 2012/0126336 A1 | 5/2012 | Anderson et al. | |
| 2012/0305991 A1* | 12/2012 | Chang et al. | 257/194 |
| 2013/0043485 A1 | 2/2013 | Ueno | |
| 2013/0049072 A1 | 2/2013 | Heineck et al. | |
| 2013/0049116 A1* | 2/2013 | Zhu et al. | 257/347 |
| 2013/0146891 A1 | 6/2013 | Xin et al. | |
| 2014/0001515 A1* | 1/2014 | Kudymov | 257/192 |
| 2014/0239346 A1* | 8/2014 | Green et al. | 257/192 |
| 2015/0034962 A1* | 2/2015 | Cao et al. | 257/76 |

OTHER PUBLICATIONS

Jin-Yu Shiu et al., "Oxygen Ion Implantation Isolation Planar Process for AlGaN/GaN HEMTs", IEEE Electron Device Letter, vol. 28, No. 6, Jun. 2007, pp. 476-478.

* cited by examiner

ISOLATION STRUCTURE IN GALLIUM NITRIDE DEVICES AND INTEGRATED CIRCUITS

CROSS REFERENCE TO RELATED APPLICATIONS

This application claims the benefit of U.S. Provisional Application No. 61/843,810, filed on Jul. 8, 2013, the entire disclosure of which is hereby incorporated by reference.

BACKGROUND OF THE INVENTION

1. Field of Invention

The present invention relates to the field of gallium nitride (GaN) devices and integrated circuits. In particular, the invention relates to a structure and method for isolating electrical devices in an integrated semiconductor device.

2. Description of the Related Art

Gallium nitride (GaN) semiconductor devices are increasingly desirable because of their ability to switch at high frequency, to carry large current, and to support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 30V-to-2000 Volts, while operating at high frequencies, e.g., 100 kHZ-100 GHz.

A GaN HEMT device includes a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted (i.e., removed) below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

Integrated circuits (ICs) consist of devices that are located adjacent to each other. Such devices could interfere with each other if not electrically isolated, preventing the ICs from functioning properly.

Figure 1A:
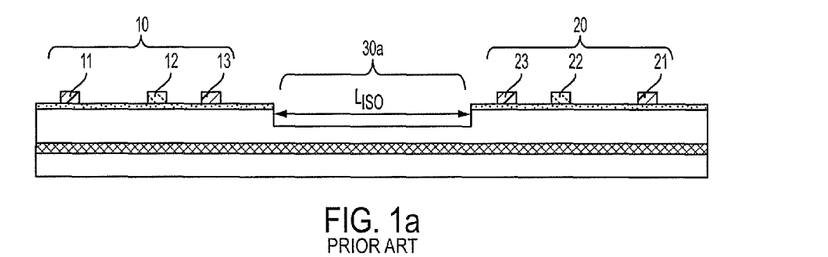
FIG. 1(a) illustrates a cross-sectional view of a conventional integrated circuit with isolation formed by etching active layers.
Figure 1B:
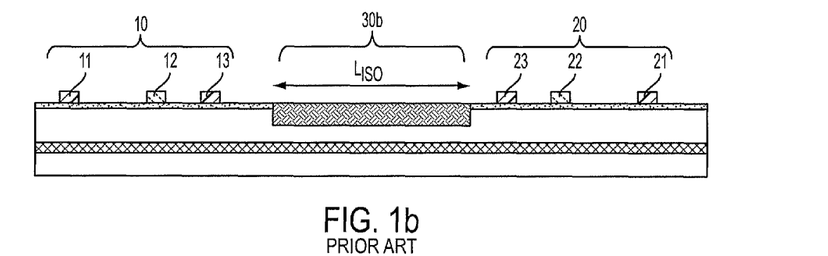
FIG. 1(b) illustrates a cross-sectional view of a conventional integrated circuit with isolation formed by implanting ions into the EPI.

FIGS. 1(a) and 1(b) illustrate an example of a conventional integrated circuit with two devices 10 and 20 with isolation area 30a, 30b disposed therebetween. Isolation area 30a, 30b is provided to intentionally remove the 2DEG to minimize parasitic capacitance. As shown, device 10 includes drain 11, gate 12 and source 13. Likewise, device 20 includes drain 21, gate 22 and source 23. The isolation area 30a, 30b electrically separates device 10 and device 20, so that the source 13 of device 10 and the source 23 of device 20 will be at different potentials.

For conventional fabricating methods, the isolation area 30a, 30b is formed by either removing the conductive layers by etching as illustrated in FIG. 1(a) or by converting the conductive layers into insulating layers by ion-implantation as illustrated FIG. 1(b). As further shown, the isolation area 30a, 30b is separated by a space of $L_{ISO}$. In gallium nitride (GaN) based materials, the isolation breakdown voltage may be proportional to $L_{ISO}$ with 50~200V per μm.

Figure 2A:
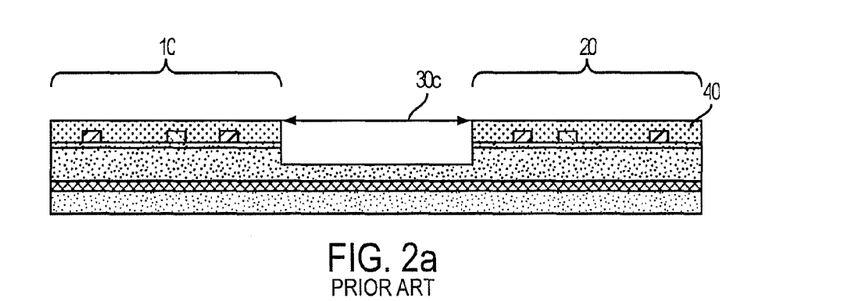
FIG. 2(a) illustrates a cross-sectional view of a conventional integrated circuit with an isolation area formed by etching away active layers using a dedicated mask.
Figure 2B:
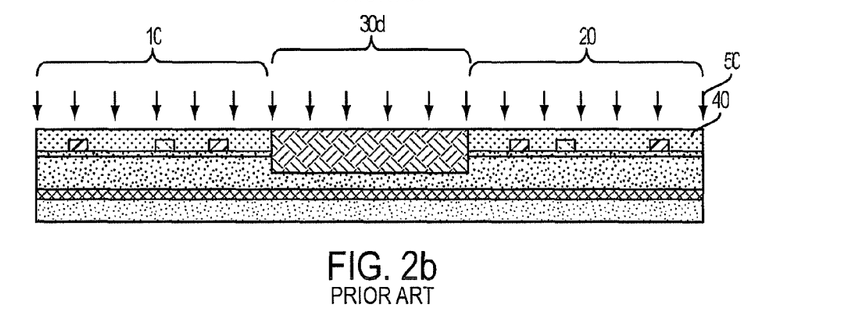
FIG. 2(b) illustrates a cross-sectional view of a conventional integrated circuit with an isolation area formed by implanting ions into active layers using a dedicated mask.

Isolation structures are typically fabricated with a dedicated mask as illustrated in FIGS. 2(a) and (b). In FIG. 2(a), isolation etching to create an isolation area 50c typically uses C12-based, BC13-based, or argon-based plasma. In FIG. 2(b), isolation implant species 50 are typically iron (Fe), magnesium (Mg), oxygen (O) or nitrogen (N). In fabricating an isolation area 50c, 50d with etching or ion-implantation, a dedicated isolation mask is used to form a patterned photoresist 40 on top of the wafer. The isolation area 50c, 50d is exposed while device regions of device 10 and device 20 are covered with the photoresist 40.

The existing methods of fabricating an isolation structure suffers from a number of disadvantages, including: (1) requiring a dedicated mask with the associated process steps that increase cost; (2) isolation by etching, which can result in an etched surface with high leakage current; and (3) isolation by ion-implantation in which the resistivity of the isolation region can degrade after the high temperature process.

Accordingly, it would be desirable to provide a process for fabricating an isolation structure that does not require a dedicated mask, results in a structure with reduced leakage current, and does not suffer from resistivity degradation of the isolation region.

SUMMARY OF THE INVENTION

Embodiments described below address the problems discussed above and other problems, by providing manufacturing method of GaN semiconductor devices that include an isolation region between two or more transistor devices.

The integrated semiconductor device disclosed herein includes a substrate layer, a buffer layer formed on the substrate layer, a gallium nitride layer formed on the buffer layer, and a barrier layer formed on the gallium nitride layer. Furthermore, ohmic contacts for a plurality of transistor devices are formed on the barrier layer. Specifically, a plurality of first ohmic contacts for the first transistor device are formed on a first portion of the surface of the barrier layer, and a plurality of second ohmic contacts for the second transistor device are formed on a second portion of the surface of the barrier layer. In addition, one or more gate structures are formed on a third portion of the surface of the barrier between the first and second transistor devices. Preferably, the gate structures and the spaces between the gate structures and the source contacts of the transistor devices collectively form an isolation region that electrically isolates the first transistor device from the second transistor device. Furthermore, the one or more gate structures have the same film stack and the same process sequences as gate contacts of the first and second transistor devices.

BRIEF DESCRIPTION OF THE DRAWINGS

The features, objects, and advantages of the present disclosure will become more apparent from the detailed description set forth below when taken in conjunction with the drawings in which like reference characters identify correspondingly elements and in which.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION OF THE PREFERRED EMBODIMENT

In the following detailed description, reference is made to certain embodiments. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings. It is to be understood that other embodiments may be employed and that various structural, logical, and electrical changes may be made.

Figure 3:
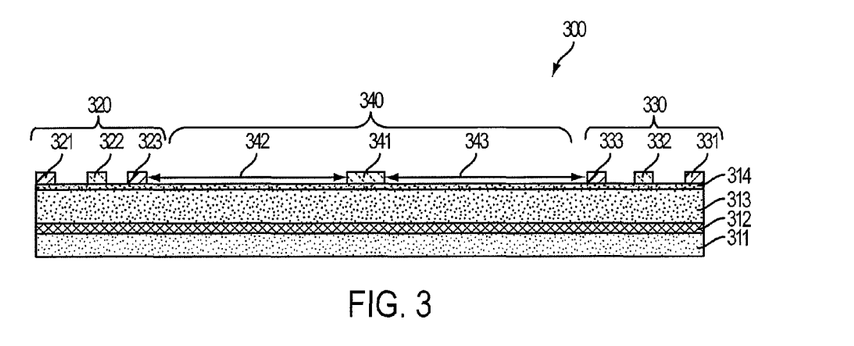
FIG. 3 is an integrated circuit with an isolation structure according to a first embodiment of the invention.

FIG. 3 illustrates a gallium nitride (GaN) semiconductor device 300 with an isolation structure 340 according to a first embodiment of the present invention. The integrated semiconductor device 300 is formed on a substrate 311 that may comprise silicon (Si), silicon carbide (SiC) or sapphire, for example. A buffer layer 312 is formed on the substrate layer 311 and separates the substrate layer 311 from a gallium nitride (GaN) layer 313. In the exemplary embodiment, the gallium nitride (GaN) layer 313 is typically un-doped and has a thickness of 0.5 to 10 µm. A barrier layer 314 is formed over and in contact with the gallium nitride (GaN) layer 313. Further, the barrier layer 314 is formed of AlGaN and is typically un-doped and has a thickness of 50 Å to 300 Å with an aluminum (Al) composition from 10% to 35%.

The integrated semiconductor device 300 includes devices 320 and 330, which includes ohmic contacts 321 and 331 that form the drains of the devices. Ohmic contacts 323 and 333 form the sources of devices 320 and 330 and gates 322 and 332 are provided between the drains 321, 331 and the sources 323, 333 of devices 320, 330, respectively. In addition, gate structure 341 is provided between devices 320 and 330 and has the same film stack and the same process sequences as gate 322 of device 320 and gate 332 of device 330. Gate structure 341, together with space 342 and space 343, form the isolation structure 340 of the invention. Isolation structure 340 electrically isolates devices 320 and 330.

In the exemplary embodiment, gate structure 341 is preferably biased to the most negative voltage in the circuit including the two devices 320, 330 and the gate driver. Assuming all devices in the circuit are enhancement-mode (E-mode) type devices, gate structure 341 can be connected to the ground. Also, in an embodiment where device 320 and device 330 form a half bridge, and if device 320 is the low side and device 330 is the high side of the half bridge circuit, gate structure 341 can be connected to source 323 of device 320. If the circuit 300 contains one depletion-mode (D-mode) device, gate structure 341 can be shorted to the negative voltage generator. If device 320 is referenced to a high voltage (i.e., its source 323 is at a higher potential than the source 333 of device 330), electrode 341 and space 342 support the voltage differential between source 323 in device 320 and source 333 in device 330. The space 342 between sources 323 and 333 determines the maximum isolation voltage from a device 320. Typically, 50-200 volts per µm can be supported in GaN based materials. Similarly, when device 330 is referenced to a high voltage, the space 343 between gate structure 341 and source 333 determines the maximum isolation voltage from a device 330.

Advantageously, the isolation is formed without a dedicated isolation mask and associated process steps in accordance with the present invention. Consequently, the isolation of the present invention has lower processing costs than the etched or implanted isolation discussed above with respect to prior art fabrication methods. Additionally, the isolation of the inventive device 300 has lower leakage than etched isolation or implanted isolation.

Figure 4:
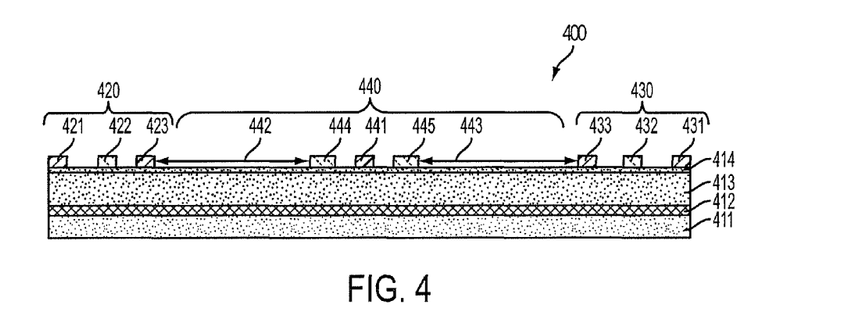
FIG. 4 is an integrated circuit with an isolation structure according to a second embodiment of the invention.

FIG. 4 illustrates a gallium nitride (GaN) semiconductor device 400 with an isolation structure 440 according to a second embodiment of the present invention. The integrated semiconductor device 400 is formed on a substrate 411 that may comprise, for example, silicon (Si), silicon carbide (SiC) or sapphire. A buffer layer 412 is formed over the substrate layer 411 and separates the substrate layer 411 from the gallium nitride (GaN) layer 413, which is formed over buffer layer 412. Preferably, the gallium nitride (GaN) layer 413 is typically un-doped and has a thickness of 0.5 to 10 µm. A barrier layer 414 is formed over and in contact with the gallium nitride (GaN) layer 413. In the exemplary embodiment, barrier layer 414 is formed of AlGaN and is typically un-doped with a thickness of 50 Å to 300 Å and with aluminum (Al) composition from 10% to 35%.

Semiconductor device 400 includes devices 420 and 430. Ohmic contacts 421, 431 form the drains of devices 420 and 430 and ohmic contacts 423 and 433 form the sources of devices 420 and 430. Further, gates 422 and 432 are provided between the drains 421, 431 and the sources 423, 433 of devices 420, 430, respectively. In addition, gate structures 444 and 445 are provided between devices 420 and 430. Gate structures 444 and 445 have the same film stack and the same process sequences as gates 422 and 432 of devices 420 and 430. In the exemplary embodiment of FIG. 4, an ohmic contact 441 is provided between gate structures 444 and 445. Space 442 is provided between gate structure 444 and source 423 of device 420 and space 443 is provided between gate structure 445 and source 433 of device 430. Collectively, gate structures 444 and 445, ohmic contact 441, and spaces 442 and 443 form the isolation structure 440 of the semiconductor device 400 according to the embodiment of the invention, electrically isolating device 420 and device 430.

In the embodiment of the invention illustrated in FIG. 4, gate structures 444 and 445 are preferably enhancement-mode structures. Preferably, gate structure 444, gate structure 445, and ohmic contact 441 are left floating and not connected to any external bias voltage. Alternatively, gate structure 444, gate structure 445, and ohmic contact 441 are shorted together and connected to the lowest voltage reference of the circuit 400. If device 420 experiences higher voltage than device 430, gate structure 444 is reverse biased and supports a voltage differential across space 442, preventing device 430 from being influenced by the high voltage to device 430. Space 442 determines the maximum isolation voltage from device 420 (i.e., at about 50-200 V per μm in GaN based materials). Similarly, when device 430 experiences a high voltage, space 443 determines the maximum isolation voltage.

It should be appreciated that the exemplary device 400 of the invention illustrated in FIG. 4 has the same advantages as the first embodiment. The isolation area 440 is formed without a dedicated isolation mask and associated process steps, has a lower processing cost than etched or implanted isolation, and has a lower leakage than etched isolation or implanted isolation.

Figure 5:
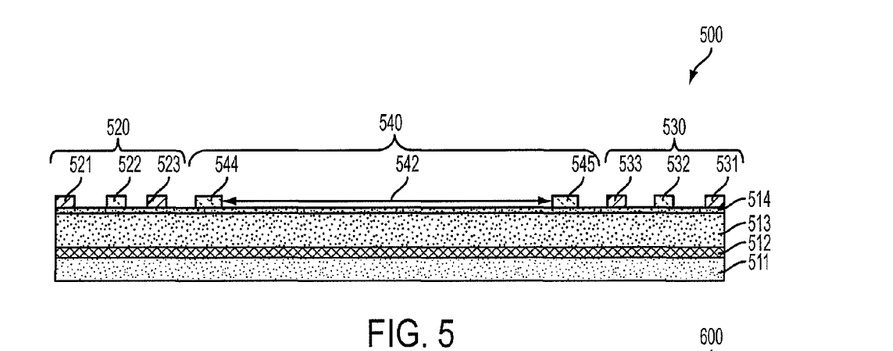
FIG. 5 is an integrated circuit with an isolation structure according to a third embodiment of the invention.

FIG. 5 illustrates a gallium nitride (GaN) semiconductor device 500 with an isolation structure 540 according to a third embodiment of the present invention. In the exemplary embodiment, the integrated semiconductor device 500 is formed on a substrate 511 that may comprise, for example, silicon (Si), silicon carbide (SiC) or sapphire. A buffer layer 512 is formed on substrate 511 and separates the substrate layer 511 from the gallium nitride (GaN) layer 513 formed on the buffer layer 512. The gallium nitride (GaN) layer 513 is typically un-doped and has a thickness of 0.5 to 10 μm. A barrier layer 514 is formed over and in contact with the gallium nitride (GaN) layer 513. Barrier layer 514 is formed of AlGaN and is typically un-doped and has a thickness of 50 Å to 300 Å. Preferably, barrier layer 514 has an aluminum (Al) composition from 10% to 35%.

Devices 520 and 530 have drains contacts 521 and 531, sources contacts 523 and 533, gates 522 and 532 disposed between the respective drains 521, 531 and sources 523, 533. Furthermore, gate structures 544 and 545 are disposed between devices 520 and 530, with gate structure 544 adjacent to source 523 of device 520 and gate structure 545 adjacent to source 533 of device 530. Gate structures 544 and 545 have the same film stack and are formed by the same process as gate 522 of device 520 and gate 532 of device 530. Gate structures 544 and 545 and space 542 between the gate structures collectively form the isolation structure 540 of the device 500 according to the exemplary embodiment illustrated in FIG. 5. Isolation structure 540 electrically isolates device 520 and device 530.

As in the embodiment illustrated in FIG. 4 discussed above, gate structures 544 and 545 are preferably enhancement-mode gates. In one embodiment, gate structure 544 is shorted to the source 523 of device 520, and gate structure 545 is shorted to the source 533 of device 530. If device 520 experiences higher voltage than device 530, gate structure 545 will be reverse biased and support a voltage differential across space 542, preventing device 530 from being influenced from device 520. If device 530 experiences higher voltage than device 520, gate structure 544 will be reverse biased and support a voltage differential across space 542, preventing device 520 from being influenced from device 530. The space 542 between gate structures 544 and 545 determines maximum isolation voltage between devices 520 and 530, at 50-200 volts per μm in GaN based materials. In one embodiment, gate structures 544 and 545 in the isolation area 540 can be connected to source 523 of device 520 and source 533 of device 530, respectively, which need not be connected to any external voltage reference. In one refinement of this embodiment, it is possible to have the gate structures 544 and 545 connected to the lowest voltage reference of the device 500.

The device 500 illustrated in FIG. 5 has the same advantages as the first and second embodiments discussed above with respect of FIGS. 3 and 4, respectively. The isolation area 540 is formed without a dedicated isolation mask and associated process steps, has lower process cost than the etched or implanted isolation, and has a lower leakage than etched isolation and implanted isolation. Additionally, the device 500 requires only one space 542, which means that the isolation area 540 may take less area and reduce cost. Furthermore, in the third embodiment of the invention, the gate structures 544 and 545 need not be connected to any external voltage reference.

Figure 6:
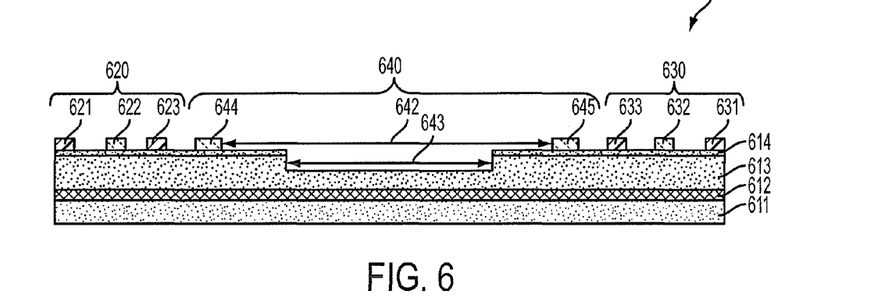
FIG. 6 is an integrated circuit with an isolation structure according to a fourth embodiment of the invention.

FIG. 6 illustrates a gallium nitride (GaN) semiconductor device 600 with an isolation structure 640 according to a fourth embodiment of the present invention. The integrated semiconductor device 600 is similar to device 500 illustrated in FIG. 5, except that there is a region 643 or opening where surface conductive layers and the two-dimensional electron gas (2DEG) of the gallium nitride (GaN) layer 613 is removed by either etching or ion implantation.

As shown, device 600 is formed on a substrate 611 with a buffer layer 612 that separates the substrate layer 611 from the gallium nitride (GaN) layer 613. A barrier layer 614 is formed on GaN layer 613 and comprises AlGaN and is typically un-doped with a thickness of 50 Å to 300 Å and an aluminum (Al) composition of 10% to 35%. Device 620 includes drain 621, gate 622 and source 623. Device 630 includes drain 631, gate 632 and source 633. Gate structures 644 and 645 have the same film stack and the same process sequences as gate 622 and gate 632. Preferably, gate structure 644 is shorted to the source 623 and gate structure 645 is shorted to the source 633. Space 642 is provided between gate structures 644 and 645, and the region 643 is formed below space 642 by removing surface conductive layers (e.g., barrier layer 614) and the two-dimensional electron gas (2DEG) from GaN layer 613 by either etching or ion implantation. Gate structures 644 and 645, space 642, and region 643 collectively form the isolation structure 640, electrically isolates devices 620 and 630.

As discussed above, the device 600 is similar to the device 500 illustrated in FIG. 5 except that an etched or implanted region 643 is provided between the two gate structures 644 and 645. Due to region 643, device 600 has lower leakage than device 500. In addition, it is possible to reduce the space between the two gate structures 644 and 645. Isolation region 643 can be formed by etching away the active layers, by ion implantation, or by self-aligned isolation formation as in co-pending U.S. provisional application No. 61/843,804, filed by applicants on Jul. 8, 2013, the entire contents of which are hereby incorporated by reference.

Figure 7A:
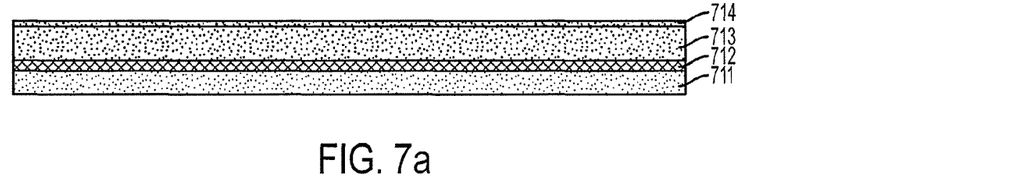
FIGS. 7(a)-7(d) illustrate selected processing steps for fabricating the isolation structure of FIG. 6.
Figure 7B:
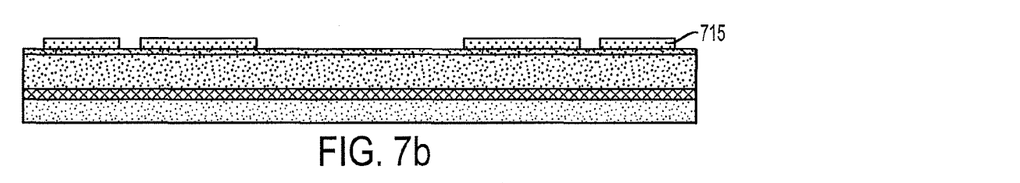
Figure 7C:
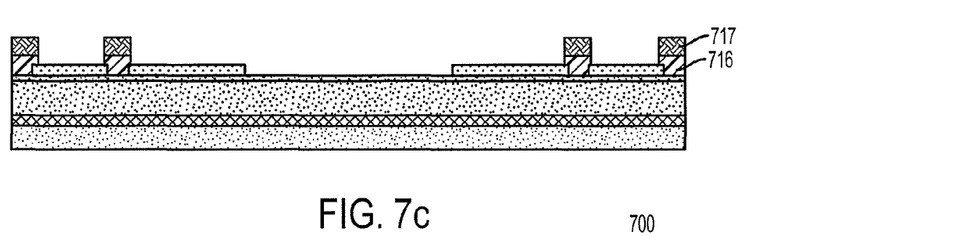
Figure 7D:
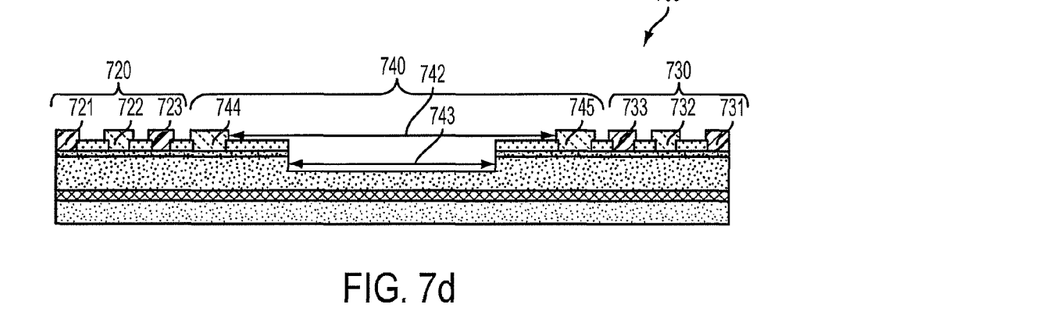

FIGS. 7(a) through 7(d) illustrate an exemplary method of manufacturing a GaN semiconductor device 600 illustrated in FIG. 6 and discussed above. In this example, isolation region 740 of the semiconductor device is formed by a self-aligned isolation technique. In particular, FIG. 7(a) illustrates forming a starting EPI structure that includes a substrate 711, a buffer layer 712, a GaN layer 713, and a barrier layer 714. It should be appreciated that the deposition can be performed using any conventional deposition technique, such as atomic layer deposition or plasma enhanced chemical vapor deposition or the like. Next, FIG. 7(b) illustrates the structure after deposition of a dielectric layer 715, and after performing a contact mask and etch. Preferably, dielectric layer 715 is a dielectric film, such as Si3N4. FIG. 7(c) illustrates the structure after depositing contact metal layers (e.g., photoresist 717), contact metal mask and metal etching. FIG. 7(d) illustrates the device after the photoresist 717 is stripped and the gate structures 744 and 745 are formed. As shown, the resulting semiconductor device includes transistor device 720 with drain, gate and source contacts 721-723, and transistor device 730 with drain, gate and source contacts 731-733. The isolation region 743 or opening where surface conductive layers and the two-dimensional electron gas (2DEG) of the gallium nitride (GaN) layer 713 is formed by either etching or ion implantation. Advantageously, the isolation structure 740 is formed without a dedicated mask.

The above description and drawings are only to be considered illustrative of specific embodiments, which achieve the features and advantages described herein. Modifications and substitutions to specific process conditions may be made. Accordingly, the embodiments of the invention are not considered as being limited by the foregoing description and drawings.

What is claimed is:

1. An integrated semiconductor device comprising:
a buffer layer disposed on a substrate layer;
a gallium nitride layer disposed on the buffer layer;
a barrier layer disposed on the gallium nitride layer;
a plurality of first device contacts for a first transistor device formed on a first portion of an exposed surface of the barrier layer;
a plurality of second device contacts for a second transistor device formed on a second portion of the exposed surface of the barrier layer;
at least one gate structure formed on a third portion of the surface of the barrier,
wherein the gate structure is disposed between the plurality of first device contacts and the plurality of second device contacts to form an isolation region of the integrated semiconductor device that electrically isolates the first transistor device from the second transistor device.

2. The integrated semiconductor device according to claim 1, wherein the plurality of first device contacts comprise source, gate and drain contacts for the first transistor device, and the plurality of second device contacts comprise source, gate and drain contacts for the second transistor device.

3. The integrated semiconductor device according to claim 2, wherein the gate structure is disposed between the respective source contacts of the first and second transistor devices.

4. The integrated semiconductor device according to claim 2, wherein the gate structure and the gate contacts of the first and second transistor devices comprise a common film stack.

5. The integrated semiconductor device according to claim 2, wherein the gate structure and the gate contacts of the first and second transistor devices are fabricated from common process sequences.

6. The integrated semiconductor device according to claim 2, wherein the gate structure is electrically coupled to a source contact of one of the first transistor device and the second transistor device.

7. The integrated semiconductor device according to claim 2, wherein the gate structure is biased at a most negative voltage in the integrated semiconductor device.

8. The integrated semiconductor device according to claim 7, wherein the barrier layer comprises a thickness between 50 Å and 300 Å.

9. The integrated semiconductor device according to claim 1, wherein the gallium nitride layer is un-doped and has a thickness between 0.5 and 10 µm.

10. The integrated semiconductor device according to claim 1, wherein the barrier layer comprises AlGaN with an aluminum composition from 10% to 35%.

11. The integrated semiconductor device according to claim 1, wherein the first transistor device and the second transistor device are adjacent.

12. The integrated semiconductor device according to claim 1, wherein the barrier layer between the first transistor device and the second transistor device is continuous.

13. An integrated semiconductor device comprising:
a buffer layer disposed on a substrate layer;
a gallium nitride layer disposed on the buffer layer;
a barrier layer disposed on the gallium nitride layer;
a plurality of first device contacts for a first transistor device formed on a first portion of an exposed surface of the barrier layer;
a plurality of second device contacts for a second transistor device formed on a second portion of the exposed surface of the barrier layer;
a pair of gate structures formed on a third portion of the surface of the barrier,
wherein the pair of gate structures are disposed between the plurality of first device contacts and the plurality of second device contacts to form an isolation region of the integrated semiconductor device that electrically isolates the first transistor device from the second transistor device.

14. The integrated semiconductor device according to claim 13, wherein the plurality of first device contacts comprise source, gate and drain contacts for the first transistor device, and the plurality of second device contacts comprise source, gate and drain contacts for the second transistor device.

15. The integrated semiconductor device according to claim 14, wherein the pair of gate structures are disposed between the respective source contacts of the first and second transistor devices.

16. The integrated semiconductor device according to claim 14, wherein the pair of gate structures and the gate contacts of the first and second transistor devices comprise a common film stack.

17. The integrated semiconductor device according to claim 14, wherein the pair of gate structures and the gate contacts of the first and second transistor devices are fabricated from common process sequences.

18. The integrated semiconductor device according to claim 14, further comprising an ohmic contact formed on the third portion of the surface of the barrier between the pair of gate structures, such that the pair of gate structures and the ohmic contact form the isolation region.

19. The integrated semiconductor device according to claim 18, wherein the pair of gate structures are enhancement-mode structures.

20. The integrated semiconductor device according to claim 19, wherein the pair of gate structures and the ohmic contact are not electrically connected to an external bias voltage.

21. The integrated semiconductor device according to claim 19, wherein the pair of gate structures and the ohmic contact are shorted to each other and are connected to a lowest voltage reference of the integrated semiconductor device.

22. The integrated semiconductor device according to claim 14, wherein the pair of gate structures are disposed adjacent to the source contacts of the first and second transistor devices, respectively, and an isolation window is formed between the pair of gate structures.

23. The integrated semiconductor device according to claim 22, wherein the isolation window is defined in the third portion of the surface of the barrier layer and a portion of the gallium nitride layer under the third portion of the barrier layer.

24. The integrated semiconductor device according to claim 23, wherein the isolation window is formed by etching or ion implantation to remove a two-dimensional electron gas of the gallium nitride layer.

25. The integrated semiconductor device according to claim 13, wherein the first transistor device and the second transistor device are adjacent.

26. The integrated semiconductor device according to claim 13, wherein the barrier layer between the first transistor device and the second transistor device is continuous.

* * * * *